United States Patent
Chen et al.

(10) Patent No.: US 9,188,649 B2
(45) Date of Patent: Nov. 17, 2015

(54) VOLTAGE CALIBRATION METHOD

(75) Inventors: Tai-Hung Chen, Hsinchu County (TW); Kuo-Chang Huang, Hsinchu County (TW)

(73) Assignee: SIMPLO TECHNOLOGY COMPANY, LTD., Hukou Township, Hsinchu County (TW)

( * ) Notice: Subject to any disclaimer, the term of this patent is extended or adjusted under 35 U.S.C. 154(b) by 575 days.

(21) Appl. No.: 13/559,613

(22) Filed: Jul. 27, 2012

(65) Prior Publication Data

US 2013/0103332 A1 Apr. 25, 2013

(30) Foreign Application Priority Data

Oct. 21, 2011 (TW) .............................. 100138391 A

(51) Int. Cl.
G01R 31/36 (2006.01)
G01R 35/00 (2006.01)

(52) U.S. Cl.
CPC ........ *G01R 31/3624* (2013.01); *G01R 31/3658* (2013.01); *G01R 31/3662* (2013.01); *G01R 35/005* (2013.01)

(58) Field of Classification Search
CPC .................................................. G01R 31/3624
USPC ....................................................... 702/63–65
See application file for complete search history.

(56) References Cited

U.S. PATENT DOCUMENTS

| 5,767,659 A * | 6/1998 | Farley ........................... 320/106 |
| 6,424,157 B1 * | 7/2002 | Gollomp et al. ............... 324/430 |
| 7,633,264 B2 | 12/2009 | Fukuzawa | |

FOREIGN PATENT DOCUMENTS

| TW | I320241 | 2/2010 |
| WO | 2006126866 A1 | 11/2006 |

* cited by examiner

*Primary Examiner* — Phuong Huynh
(74) *Attorney, Agent, or Firm* — Winston Hsu; Scott Margo

(57) ABSTRACT

In a rechargeable battery set, an average voltage is computed from average voltage drop produced by the sum of internal resistances of each battery cell. A calculated internal resistance of each battery cell is then computed from a measured voltage of each battery cell and the average voltage. Finally, the measured voltage of each battery cell is calibrated according to the calculated internal resistance and a calibrated voltage of each battery cell may be computed. In such way, the calibrated voltage of each battery cell is much closer to a real voltage of the battery cell, which provides a battery control unit more precise information when charging/discharging the battery cells.

14 Claims, 3 Drawing Sheets

VOLTAGE CALIBRATION METHOD

BACKGROUND OF THE INVENTION

1. Field of the Invention

The invention relates to a voltage calibration method for a rechargeable battery set, and particularly, to a voltage calibration method that calibrates the measured voltage of each battery cell via reducing the effect of internal resistance of each battery cell.

2. Description of the Prior Art

To supply sufficient voltage for equipments, a rechargeable battery set is usually composed of many battery cells serially connected with one another. Such combination of battery cells may well serve as the power source for notebooks, medical equipments, or equipments with high power consumption. Generally, the serially connected battery cells should be balanced in voltage as for the design of the rechargeable battery set. It is, however, highly possible that each battery cell may have different measured voltage detected by the control unit inside the rechargeable battery set, which is mainly caused by resistances from the wiring between the battery cells and the nickel rods attached to the battery cells at the ends of the battery set. Some techniques have been used in the prior art to balance the voltage of each battery cell inside the rechargeable battery set. These techniques substantially include two major types: cell voltage balance and cell capacity balance. Nevertheless, such voltage balance techniques are incapable of dealing with the internal resistances caused by the wiring and the nickel rods.

For example, in a rechargeable battery set having many battery cells serially connected with one another, the internal resistance of each battery cell may alter due to the layout of the battery cells. Secondly, the battery cells at the ends of the battery set commonly have higher internal resistances with respect to other battery cells because of the nickel rods. As with the influence of the internal resistances, the control unit may mistakenly determine the rechargeable battery set to be fully charged in charging process but the battery cells are actually far from fully charged. The control unit may also mistakenly learn that the battery set is already out of power in discharging process, while the battery cells do still have some power. This just make the rechargeable battery set provide less than its specified capacity, and incorrect charging/discharging process also seriously damages the life of the battery set.

SUMMARY OF THE INVENTION

To solve the problem mentioned above on incomplete charging/discharging issue of a rechargeable battery set due to voltage difference caused by the internal resistance of each battery cell, in the embodiments of the invention, a voltage calibration method for a rechargeable battery set is provided. The rechargeable battery set includes a first battery cell and a second battery cell serially connected with each other and a control unit electrically connected to the first battery cell and the second battery cell. The voltage calibrating method includes using the control unit to perform the following steps: obtaining a first measured voltage of the first battery cell and a second measured voltage of the second battery cell respectively; computing an average voltage according to the first measured voltage and the second measured voltage; computing a first calculated internal resistance of the first battery cell according to the first measured voltage, the average voltage, and a charging current running through the first battery cell; obtaining a first updated measured voltage of the first battery cell and an updated charging current running through the first battery cell; and computing a first calibrated voltage of the first battery cell according to the first updated measured voltage, the updated charging current, and the first calculated internal resistance.

In another embodiment, the invention also provides a voltage calibration method for a rechargeable battery set. The rechargeable battery set includes a plurality of battery cells serially connected with one another and a control unit electrically connected to the plurality of battery cells. The voltage calibrating method includes using the control unit to perform the following steps: obtaining a plurality of measured voltages of the battery cells respectively; computing an average voltage according to the plurality of measured voltages; computing a plurality of calculated internal resistances corresponding to the battery cells respectively according to the corresponding measured voltage, the average voltage, and a charging current running through the battery cells; obtaining a plurality of updated measured voltages of the battery cells and an updated charging current running through the battery cells; and computing a plurality of calibrated voltages corresponding to the battery cells respectively according to the corresponding updated measured voltage, the updated charging current, and the corresponding calculated internal resistance.

The voltage calibration method provided in the embodiments of the invention calibrates the measured voltage of each battery cell according to the proportion of internal resistances so that the calibrated voltage of each battery cell approaches actual voltage, providing much more precise voltage data when charging/discharging the rechargeable battery set.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
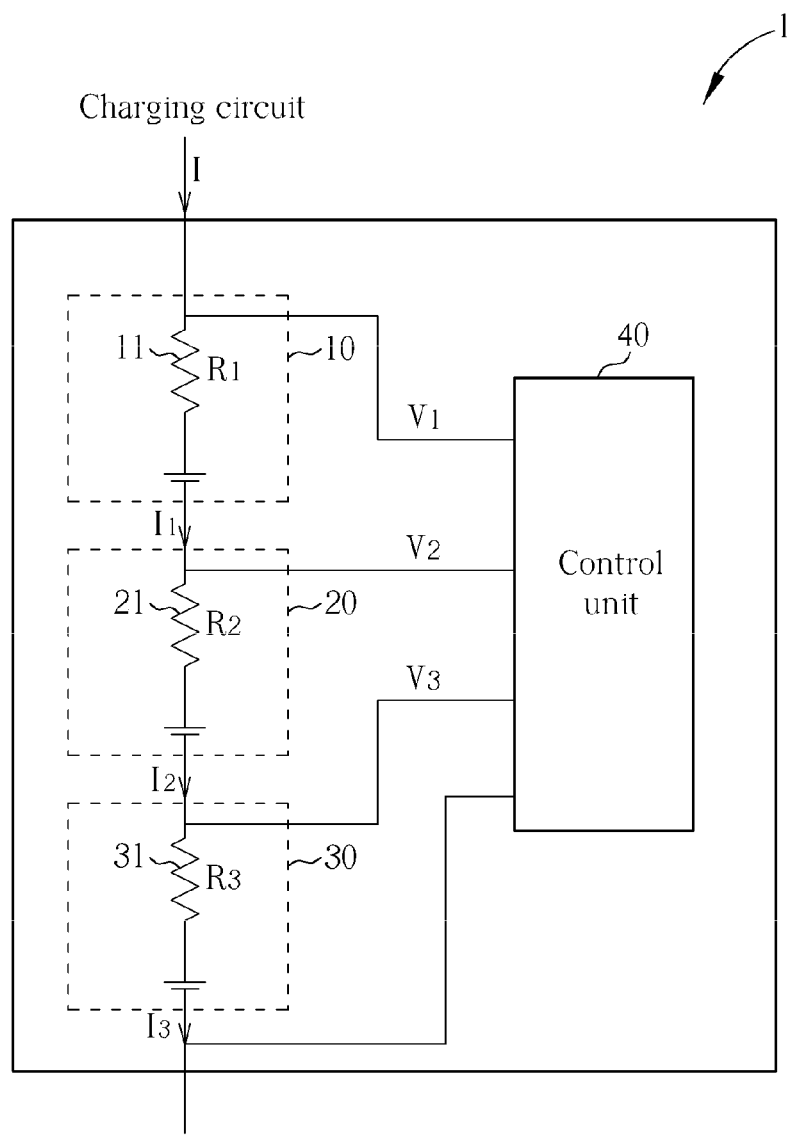
FIG. 1 is an illustration of a rechargeable battery set using voltage calibration according to the invention.

Please refer to FIG. 1, which is an illustration of a rechargeable battery set 1 using voltage calibration according to the invention. The rechargeable battery set 1 is composed by a plurality of battery cells serially connected with one another. Each battery cell is an 18650 rechargeable lithium cell or rechargeable battery cell of other possible type. The rechargeable battery set 1 in FIG. 1 is exemplarily composed of a first battery cell 10, a second battery cell 20, and a third battery cell 30 serially connected with one another. However, the number of the battery cells in the rechargeable battery set should not be limited by the embodiment. Two or more battery cells may also be deployed in the rechargeable battery set 1 and multiple strings of serially connected battery cells may further be connected with one another in parallel manner. The rechargeable battery set 1 includes a control unit 40 electrically connected to the first battery cell 10, the second battery cell 20, and the third battery cell 30 so that a first measured voltage $V_1$ of the first battery cell 10, a second measured voltage $V_2$ of the second battery cell 20, and a third measured voltage $V_3$ of the third battery cell 30 may be obtained respectively by the control unit 40. Additionally, the control unit 40 also obtains a current $I_1$ running through the first battery cell 10, a current $I_2$ running through the second battery cell 20, and a current $I_3$ running through the third battery cell 30. Since, in the embodiments of the invention, current flowing to the control unit 40 is much smaller compared with $I_1$, $I_2$, $I_3$ and can be ignored during the discussion of the embodiments, current discussed in the description may is regarded as $I_1=I_2=I_3=I$ for the embodiments. Furthermore, the control unit 40 is in charge of the charging/discharging process of the rechargeable battery set 1. With the effect by the ornamental design of the rechargeable battery set 1 and the wiring between the nickel rods and each battery cell, the first battery cell 10, the second battery cell 20, and the third battery cell 30 have a first internal resistance 11 ($R_1$), a second internal resistance 21 ($R_2$), and a third internal resistance 31 ($R_3$) respectively. The internal resistances remain unknown to the control unit 40 and practically have the relation (but not a limitation to the invention): $R_1 \gg R_2 \sim R_3$ (or $R_3 \gg R_1 \sim R_2$) since the battery cells 10, 30 at the ends of the rechargeable battery set 1 have direct connection with the nickel rods.

Figure 2:
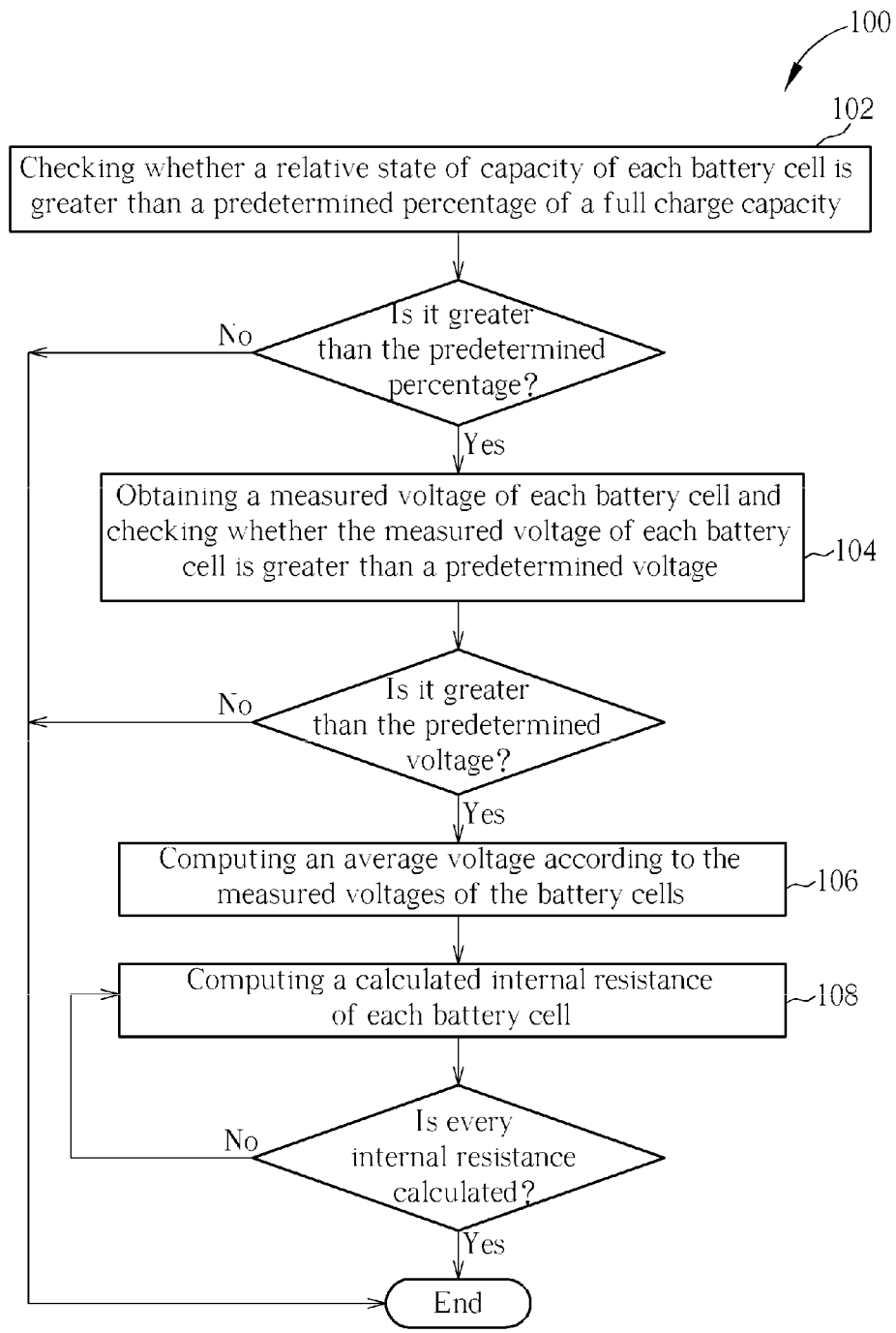
FIG. 2 is an illustration of a flow chart showing internal resistance computing process according to the voltage calibration method of the invention.

To reduce the voltage drop caused by the internal resistances in the rechargeable battery set 1 such that the rechargeable battery set 1 may have better charging/discharging efficiency, a voltage calibration method for the rechargeable battery set according to the invention is provided. Please refer to FIG. 2, which is an illustration of a flow chart showing internal resistance computing process 100 according to the voltage calibration method of the invention. The internal resistance computing process 100 computes the internal resistances during charging/discharging and includes the following steps:

Step 102: checking whether a relative state of capacity of each battery cell is greater than a predetermined percentage of a full charge capacity?

Step 104: obtaining a measured voltage of each battery cell and checking whether the measured voltage of each battery cell is greater than a predetermined voltage?

Step 106: computing an average voltage according to the measured voltages of the battery cells;

Step 108: computing a calculated internal resistance of each battery cell.

During the charging process, when the capacity of each battery cell of the rechargeable battery set 1 exceeds a certain percentage of full charge capacity and the voltage of each battery cell is greater than a predetermined voltage, the internal resistance of each battery cell is much likely to be computed with much precision. In other words, however, the calculated internal resistance of each battery cell may also be obtained with simply executing Step 106, 108, without the need of executing Step 102, 104. Hence, in a preferred embodiment of the invention, the control unit 40 first checks whether the relative state of capacity (RSOC) of each battery cell is greater than a predetermined percentage of the full charge capacity (FCC) in Step 102. For example, assuming the full charge capacity of each battery cell is FCC and the control unit 40 checks whether the relative state of capacity of each battery cell is greater than 50% of FCC in Step 102. When the relative state of capacity of each battery cell is greater than 50% of FCC, following steps are executed. In Step 104, the control unit 40 obtains a first measured voltage $V_1$ of the first battery cell 10, a second measured voltage $V_2$ of the second battery cell 20, and a third measured voltage $V_3$ of the third battery cell 30. The control unit 40 then checks whether the measured voltage of each battery cell is greater than a predetermined voltage (3.7V for example), and then Step 106 and Step 108 are executed. Please be noted that the voltage calibration method, including the internal resistance computing process 100 in FIG. 2 and a voltage calibrating process 200 in FIG. 3, may also be performed when the rechargeable battery set 1 is discharging, which basically has similar condition as the charging process. Notice also should be made that the exemplary figures, like 50% and 3.7V, in the previous description should not be regarded as a limitation. Any person skilled in the art should be able to, without undergoing over experiment, choose a different percentage and predetermined voltage to perform the method of the invention according to a practical condition.

Because the first measured voltage $V_1$, the second measured voltage $V_2$, and a third measured voltage $V_3$ are all affected by the internal resistances to be greater than the actual voltage of each battery cell, the control unit 40 will compute an average voltage $V_{avg}$ according to $V_1$, $V_2$, and $V_3$ in Step 106, where the average voltage $V_{avg}$ is computed with same weight of $V_1$, $V_2$, $V_3$:

$$V_{avg}=(V_1+V_2+V_3)/n;$$

where n is the number of the battery cells and is 3 in this embodiment.

However, the average voltage $V_{avg}$ may also be computed by adding different weight to each measured voltage:

$$V_{avg}=(0.99V_1+1.005V_2+1.005V_3)/n;$$

The control unit 40 then computes the calculated internal resistance of each battery cell according to the each measured voltage, the average voltage $V_{avg}$, and a charging current I that flows through the rechargeable battery set 1 during the charging process. For example, although the first internal resistance $R_1$ of the first battery cell 10 is unknown, a first calculated internal resistance $R_{1e}$ of the first battery cell 10 is obtainable in Step 108 according to the following equation:

$$R_{1e}=|(V_1-V_{avg})/I|;$$

The control unit 40 may also obtain a second calculated internal resistance $R_{2e}=|(V_2-V_{avg})/I|$ of the second battery cell 20 and a third calculated internal resistance $R_{3e}=|(V_3-V_{avg})/I|$ of the third battery cell 30. The internal resistance computing process 100 is done when all the calculated internal resistances of all battery cells are obtained.

Figure 3:
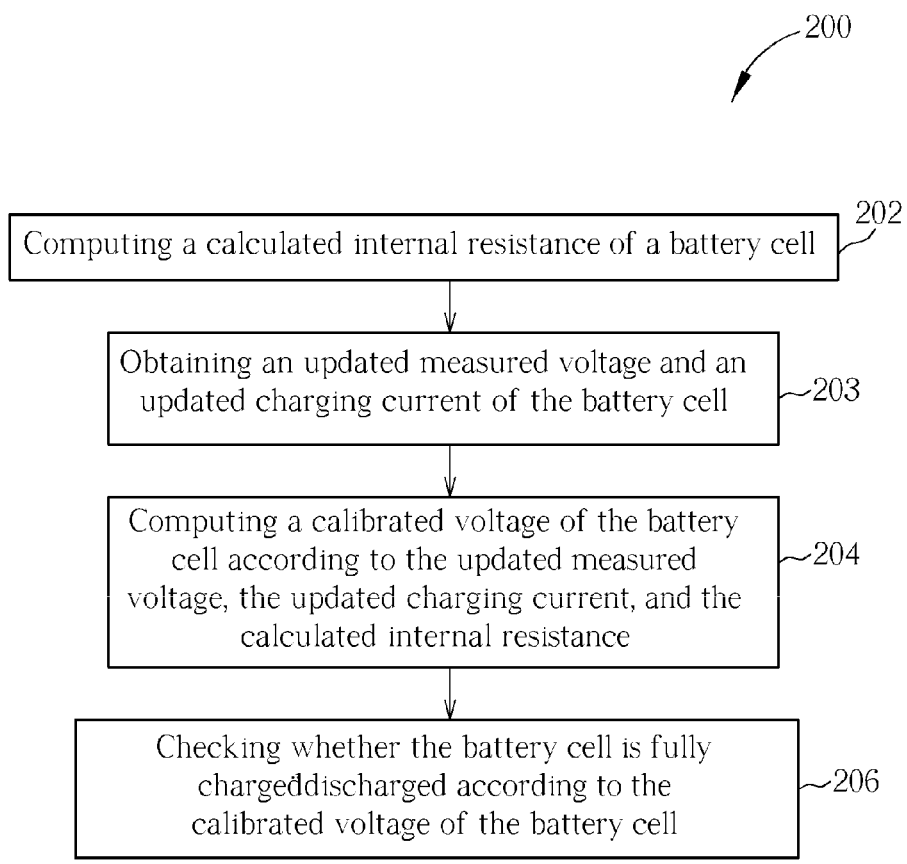
FIG. 3 is an illustration of a flow chart showing voltage calibration process according to the voltage calibration method of the invention.

Please refer to FIG. 3, which is an illustration of a flow chart showing voltage calibration process 200 according to the voltage calibration method of the invention:

Step 202: computing a calculated internal resistance of a battery cell;

Step 203: obtaining an updated measured voltage and an updated charging current of the battery cell;

Step 204: computing a calibrated voltage of the battery cell according to the updated measured voltage, the updated charging current, and the calculated internal resistance;

Step 206: checking whether the battery cell is fully charged/discharged according to the calibrated voltage of the battery cell.

Since the calculated internal resistances $R_{1e}$, $R_{2e}$, $R_{3e}$ of the battery cells are computed in the internal resistance computing process 100, the control unit 40 may directly obtain the first calculated internal resistance $R_{1e}=|(V_1-V_{avg})/I|$ in Step 202. In Step 203, the control unit 40 then obtains a first updated measured voltage $V_1'$ of the first battery cell 10 and an updated charging current $I'$. In Step 204, the control unit 40 computes a first calibrated voltage $V_{1c}$ of the first battery cell 10 according to the first updated measured voltage $V_1'$, the updated charging current $I'$, and the first calculated internal resistance $R_{1e}$:

$$V_{1c}=V_1'-I'R_{1e};$$

Please be noted that $V_1'$ is an 'updated' measured voltage, which alters at every measure with the environmental and using condition of the rechargeable battery set 1, i.e., $V_1'$ may be the same as or different from $V_1$ previously measured when computing $R_{1e}$. Likewise, $I'$ is an 'updated' measured current, which alters at every measure with the environmental and using condition of the rechargeable battery set 1, i.e., $I'$ may be the same as or different from I previously measured when computing $R_{1e}$. As for the calculated internal resistance $R_{1e}$, no re-computing is needed once $R_{1e}$ is obtained in this embodiment, which yet to be a limitation to the invention. In some situations, $R_{1e}$ may also go through re-computing by executing the internal resistance computing process 100 in a predetermined period of time, like a few weeks. $R_{1e}$ may also be recomputed every time the rechargeable battery set 1 is undergoing charging process.

Accordingly, in Step 206, when the rechargeable battery set 1 is undergoing charging process, the control unit 40 checks whether the first battery cell 10 is fully charged according to the first calibrated voltage $V_{1c}$ of the first battery cell 10. The first calibrated voltage $V_{1c}$ is actually lower than the first updated measured voltage $V_1'$ the control unit 40 obtained from the first battery cell 10, which means the voltage drop caused by the internal resistance of the first battery cell 10 is considered and eliminated. During the charging process, as the first updated measured voltage $V_1'$ is detected to have reached the specified fully charged voltage but the first calibrated voltage $V_{1c}$ is yet to reach the specified fully charged voltage, the control unit 40 will determine the first battery cell 10 as not being fully charged. The control unit 40 continues to charge the first battery cell 10 and doesn't stop charging the first battery cell 10 until the first calibrated voltage $V_{1c}$ reaches the specified fully charged voltage of the first battery cell 10. In such way, the first battery cell 10 may have better capacity as for its fully charged status. The rest of the battery cells in the rechargeable battery set 1 have similar voltage calibration process and the description is omitted here for brevity.

Similarly, in Step 206, when the rechargeable battery set 1 is undergoing discharging process, the control unit 40 checks whether the first battery cell 10 should stop discharging any further according to the first calibrated voltage $V_{1c}$ of the first battery cell 10. The first calibrated voltage $V_{1c}$ is actually lower than the first updated measured voltage $V_1'$ the control unit 40 obtained from the first battery cell 10, and therefore during the discharging process, as the first updated measured voltage $V_1'$ is detected yet to have reached the specified discharging cut-off voltage but the first calibrated voltage $V_{1c}$ has already reached the specified fully charged voltage, the control unit 40 will determine the first battery cell 10 is required to stop discharging. In such way, the first battery cell 10 may have better ability to prevent from overly discharging.

Additionally, since the calculated internal resistance of each battery cell in Step 108 is related to the actual measured voltage of each battery cell, the calibrated voltage computed in Step 204 responds, to some extent, to the voltage drop caused by each internal resistance. That is, when the first battery cell 10, compared with other battery cells, has larger internal resistance, the first calibrated voltage $V_{1c}$ computed in Step 204 will show larger correction with respect to the first updated measured voltage $V_1'$.

To more specifically describe the voltage calibration method of the invention, an exemplary embodiment is made as followed.

According to Step 104, the control unit 40 measures and obtains a first measured voltage $V_1$ of the first battery cell 10 as 3806 mV, a second measured voltage $V_2$ of the second battery cell 20 as 3801 mV, and a third measured voltage $V_3$ of the third battery cell 30 as 3802 mV, while the charging current I during the charging process is 1 A.

According to Step 106, the average voltage $V_{avg}$ is then computed to be $(V_1+V_2+V_3)/n=(3806+3801+3802)/3=3803$ (mV). Next in Step 108, each calculated internal resistance of each battery cell is computed as followed:

$$R_{1e}=|(V_1-V_{avg})/I|=|(3806-3803)/1|=3 \text{ (m}\Omega\text{)};$$

$$R_{2e}=|(V_2-V_{avg})/I|=|(3801-3803)/1|=2 \text{ (m}\Omega\text{)};$$

$$R_{3e}=|(V_3-V_{avg})/I|=|(3802-3803)/1|=1 \text{ (m}\Omega\text{)};$$

According to Step 202, the control unit 40 first gets the calculated internal resistances $R_{1e}$, $R_{2e}$, $R_{3e}$ of each battery cell. Next, according to Step 203, the first updated measured voltage $V_1'$ of the first battery cell 10 is obtained as 3807 mV, a second updated measured voltage $V_2'$ of the second battery cell 20 is obtained as 3802 mV, and a third updated measured voltage $V_3'$ of the third battery cell 30 is obtained as 3802 mV, while the updated charging current $I'$ during the charging process is detected to be 1.1 A. According to Step 204, each calibrated voltage of each battery cell is computed as followed:

$$V_{1c}=V_1'-I'R_{1e}=3807-1.1\times3=3803.7 \text{ (mV)};$$

$$V_{2c}=V_2'-I'R_{2e}=3802-1.1\times2=3799.8 \text{ (mV)};$$

$$V_{3c}=V_3'-I'R_{3e}=3802-1.1\times1=3800.9 \text{ (mV)};$$

The calibrated voltages closer to the real voltages of the battery cells may be obtained.

The invention discloses the voltage calibration method and the rechargeable battery set using such method. The average voltage is computed from average voltage drop produced by the sum of internal resistances of each battery cell of the rechargeable battery set. The calculated internal resistance of each battery cell is then computed from the measured voltage of each battery cell and the average voltage. Finally, the measured voltage of each battery cell is calibrated according to the calculated internal resistance and the calibrated voltage of each battery cell may be computed. In such way, the calibrated voltage of each battery cell is much closer to the real voltage of the battery cell, which provides a battery control unit more precise information when charging/discharging the battery cells.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A voltage calibration method for a rechargeable battery set, wherein the rechargeable battery set includes a first battery cell and a second battery cell serially connected with each other and a control unit electrically connected to the first battery cell and the second battery cell, the voltage calibrating method comprising the following steps:

when the control unit is charging or discharging the first battery cell and the second battery cell, the control unit obtaining a first measured voltage of the first battery cell and a second measured voltage of the second battery cell respectively;

the control unit computing an average voltage according to the first measured voltage and the second measured voltage, and computing a first calculated internal resistance of the first battery cell according to the first measured voltage, the average voltage, and a charging current running through the first battery cell;

the control unit obtaining a first updated measured voltage of the first battery cell and an updated charging current running through the first battery cell, and computing a first calibrated voltage of the first battery cell according to the first updated measured voltage, the updated charging current, and the first calculated internal resistance, and the control unit controlling the charging or discharging of the first battery cell according to the first calibrated voltage of the first battery cell.

2. The voltage calibration method of claim 1, further comprising the following steps:

the control unit checking whether a relative state of capacity (RSOC) of the first battery cell is greater than a predetermined percentage of a full charge capacity (FCC) of the first battery cell, and checking whether the first measured voltage is greater than a predetermined voltage; and the control unit computing the first calculated internal resistance according to the first measured voltage, the average voltage, and the charging current when the RSOC of the first battery cell is greater than the predetermined percentage of the FCC of the first battery cell and the first measured voltage is greater than the predetermined voltage.

3. The voltage calibration method of claim 1, further comprising the following steps:

the control unit computing a second calculated internal resistance of the second battery cell according to the second measured voltage, the average voltage, and the charging current running through the second battery cell;

the control unit obtaining a second updated measured voltage of the second battery cell and an updated charging current running through the second battery cell, and computing a second calibrated voltage of the second battery cell according to the second updated measured voltage, the updated charging current, and the second calculated internal resistance; and the control unit controlling the charging or discharging of the second battery cell according to the second calibrated voltage of the second battery cell.

4. The voltage calibration method of claim 1, further comprising the following step: the control unit checking whether the first battery cell is fully charged according to the first calibrated voltage as the control unit is charging the first battery cell.

5. The voltage calibration method of claim 1, further comprising the following step: the control unit checking whether the first battery cell is fully discharged according to the first calibrated voltage as the control unit is discharging the first battery cell.

6. The voltage calibration method of claim 1, wherein the control unit computes the average voltage according to the first measured voltage and the second measured voltage with same weight.

7. The voltage calibration method of claim 1, wherein the control unit computes the first calculated internal resistance according to the following condition:

$$R_{1e}=|(V_1-V_{avg})/I|;$$

where $R_{1e}$ is the first calculated internal resistance, $V_1$ is the first measured voltage, $V_{avg}$ is the average voltage, and I is the charging current.

8. The voltage calibration method of claim 1, wherein the control unit computes the first calibrated voltage according to the following condition:

$$V_{1c}=V_1'-I'R_{1e};$$

where $V_{1c}$ is the first calibrated voltage, $V_1'$ is the first updated measured voltage, $I'$ is the updated charging current, and $R_{1e}$ is the first calculated internal resistance.

9. A voltage calibration method for a rechargeable battery set, wherein the rechargeable battery set includes a plurality of battery cells serially connected with one another and a control unit electrically connected to the plurality of battery cells, the voltage calibrating method comprising the following steps:

when the control unit is charging or discharging the plurality of battery cells, the control unit obtaining a plurality of measured voltages of the battery cells respectively;

the control unit computing an average voltage according to the plurality of measured voltages, and computing a plurality of calculated internal resistances corresponding to the battery cells respectively according to the corresponding measured voltage, the average voltage, and a charging current running through the battery cells;

the control unit obtaining a plurality of updated measured voltages of the battery cells and an updated charging current running through the battery cells, and computing a plurality of calibrated voltages corresponding to the battery cells respectively according to the corresponding updated measured voltage, the updated charging current, and the corresponding calculated internal resistance, and the control unit controlling the charging or discharging of the plurality of battery cells according to the plurality of calibrated voltages of the plurality of battery cells.

10. The voltage calibration method of claim 9, further comprising the following steps:

the control unit checking whether a relative state of capacity (RSOC) of each battery cell is greater than a predetermined percentage of a full charge capacity (FCC) of each battery cell, and checking whether the measured voltage of each battery cell is greater than a predetermined voltage; and the control unit computing the calculated internal resistance of each battery cell according to the corresponding measured voltage, the average voltage, and the charging current when the RSOC of each battery cell is greater than the predetermined percentage of the FCC of each battery cell and the measured voltage of each battery cell is greater than the predetermined voltage.

11. The voltage calibration method of claim 9, further comprising the following step: the control unit checking whether each battery cell is fully charged according to the corresponding calibrated voltage as the control unit is charging the battery cells.

12. The voltage calibration method of claim 9, further comprising the following step: the control unit checking whether each battery cell is fully discharged according to the corresponding calibrated voltage as the control unit is discharging the battery cells.

13. The voltage calibration method of claim 9, wherein the control unit computes the average voltage according to the plurality of measured voltages with equal weight of each measured voltage.

14. A rechargeable battery set, comprising:
a plurality of battery cells serially connected with one another; and
a control unit electrically connected to the plurality of battery cells, the control unit:
  obtaining a plurality of measured voltages of the battery cells respectively;
  computing an average voltage according to the plurality of measured voltages;
  computing a plurality of calculated internal resistances corresponding to the battery cells respectively according to the corresponding measured voltage, the average voltage, and a charging current running through the battery cells;
  obtaining a plurality of updated measured voltages of the battery cells and an updated charging current running through the battery cells;
  computing a plurality of calibrated voltages corresponding to the battery cells respectively according to the corresponding updated measured voltage, the updated charging current, and the corresponding calculated internal resistance; and
  controlling the charging or discharging of the plurality of battery cells according to the plurality of calibrated voltages of the plurality of battery cells.

* * * * *